United States Patent
Howland, Jr. et al.

(10) Patent No.: US 7,190,186 B2
(45) Date of Patent: Mar. 13, 2007

(54) METHOD AND APPARATUS FOR DETERMINING CONCENTRATION OF DEFECTS AND/OR IMPURITIES IN A SEMICONDUCTOR WAFER

(75) Inventors: William H. Howland, Jr., Wexford, PA (US); Brian R. Bobrzynski, Pittsburgh, PA (US)

(73) Assignee: Solid State Measurements, Inc., Pittsburgh, PA (US)

(*) Notice: Subject to any disclaimer, the term of this patent is extended or adjusted under 35 U.S.C. 154(b) by 217 days.

(21) Appl. No.: 10/952,130

(22) Filed: Sep. 28, 2004

(65) Prior Publication Data
US 2006/0066323 A1    Mar. 30, 2006

(51) Int. Cl.
*G01R 31/26* (2006.01)
(52) U.S. Cl. ............... 324/765; 324/751; 324/752
(58) Field of Classification Search ................ None
See application file for complete search history.

(56) References Cited

U.S. PATENT DOCUMENTS

| | | | |
|---|---|---|---|
| 5,804,980 A | * | 9/1998 | Nikawa ............... 324/752 |
| 5,815,002 A | * | 9/1998 | Nikawa ............... 324/765 |
| 6,657,454 B2 | | 12/2003 | Howland |
| 6,943,578 B1 | * | 9/2005 | Sanda et al. ......... 324/765 |

* cited by examiner

*Primary Examiner*—Minh N. Tang
(74) *Attorney, Agent, or Firm*—The Webb Law Firm

(57) ABSTRACT

To determine a concentration of defects and/or impurities in a semiconductor wafer, a first value of current is caused to flow in the semiconductor wafer having a substrate of semiconducting material. The semiconductor wafer is exposed to a pulse of light whereupon electron-hole pairs generated in the semiconductor wafer in response to the light pulse cause the current to increase to a second value. After termination of the light pulse, the rate of change of the current from the second value toward the first value is determined. A concentration of defects and/or impurities in the semiconductor wafer is determined as a function of the rate of change.

19 Claims, 2 Drawing Sheets

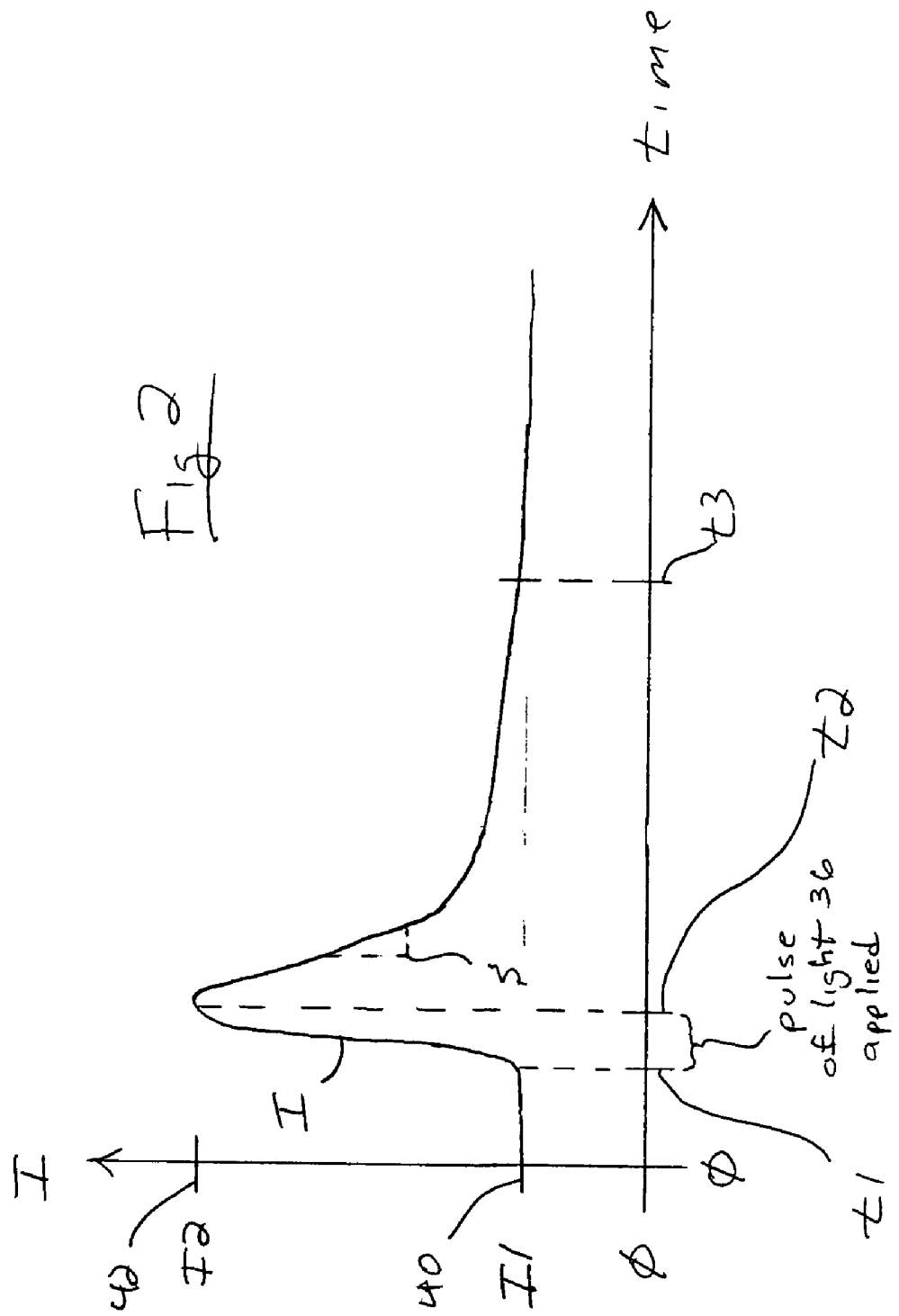

METHOD AND APPARATUS FOR DETERMINING CONCENTRATION OF DEFECTS AND/OR IMPURITIES IN A SEMICONDUCTOR WAFER

BACKGROUND OF THE INVENTION

1. Field of the Invention

The present invention relates to testing of semiconductor wafers and, more particularly, to determining a relative concentration of defects and/or impurities in a semiconductor wafer.

2. Description of Related Art

During processing of a semiconductor wafer to form integrated circuits thereon, it is often desirable to detect a relative concentration of defects and/or impurities in the semiconductor wafer to determine if the concentration of defects and/or impurities in the semiconductor wafer is within acceptable tolerance(s). To this end, it is often desirable to detect whether the processing steps utilized to form the integrated circuits are causing changes in the concentration of defects and/or impurities in the semiconductor wafer.

Heretofore, measurements of the concentration of defects and/or impurities in a semiconductor wafer involved corona-based and/or CV-based measurements which require the presence of a relatively thick dielectric layer on the semiconducting material of the semiconductor wafer. This prerequisite prevented these tools from making measurements on the semiconducting material itself or on a semiconductor wafer having a relatively thin dielectric layer, i.e., a thickness of no greater than about 30 Angstroms.

Accordingly, what is needed, and not disclosed in the prior art, is a method and apparatus for determining the relative concentration of defects and/or impurities in a semiconductor wafer that either has no dielectric layer over the semiconducting material of the semiconductor wafer or has a relatively thin, i.e., no greater than 30 Angstroms, dielectric layer on the semiconducting material of the semiconductor wafer.

SUMMARY OF THE INVENTION

The invention is a method of determining a concentration of defects and/or impurities in a semiconductor wafer. The method includes (a) providing a semiconductor wafer having a substrate of semiconducting material; (b) forming an electrical contact with a top surface of the semiconductor wafer; (c) causing a first current value to flow in the semiconductor wafer via the electrical contact; (d) exposing the semiconductor wafer under or adjacent the electrical contact formed in step (b) to light whereupon a second current value flows in the semiconductor wafer; (e) terminating the light; (f) determining a rate of change of the current from the second value toward the first value; and (g) determining a concentration of defects and/or impurities in the semiconductor wafer as a function of the rate of change determined in step (f).

The top surface of the semiconductor wafer can be either a top surface of the semiconducting material of the semiconductor wafer or a top surface of a dielectric layer overlaying the top surface of the semiconducting material of the semiconductor wafer. Desirably, the dielectric layer has a thickness of no greater than 30 Angstroms.

Step (g) can include determining if the rate of change in step (f) is greater than, less than, equal to, or within a desired range of an exemplary rate of change.

The electrical contact can be formed via a probe having an elastically deformable and electrically conductive tip that deforms within its elastic limits when it touches the top surface of the semiconductor wafer but does not damage the top surface of the semiconductor wafer, or a drop of liquid mercury deposited on the top surface of the semiconductor wafer.

The method can further include (h) performing at least one integrated circuit processing step on the semiconductor wafer; (i) forming another electrical contact with the top surface of the semiconductor wafer; (j) causing a third current value to flow in the semiconductor wafer via the other electrical contact; (k) exposing the semiconductor wafer under or adjacent the other electrical contact formed in step (i) to light whereupon a fourth current value flows in the semiconductor wafer; (l) terminating the light; (m) determining a rate of change of the current from the fourth value toward the third value; (n) determining a concentration of defects and/or impurities in the semiconductor wafer as a function of the rate of change determined in step (m); and (o) determining if a change between the concentration determined in step (n) and the concentration determined in step (g) is within acceptable tolerance(s).

Desirably, the semiconductor wafer is exposed to the same intensity of light in steps (d) and (k). The difference between the first and third values of current can be the same as a difference between the second and fourth values of current.

The invention is also a method of determining a concentration of defects and/or impurities in a semiconductor wafer that includes (a) causing a first current value to flow in a semiconductor wafer having a substrate of semiconducting material; (b) exposing the semiconductor wafer to a pulse of light whereupon electron-hole pairs generated in the semiconductor wafer in response to the light pulse cause the current to increase to a second value; (c) after termination of the pulse of light, determining a rate of change of the current from the second value toward the first value; and (d) determining a concentration of defects and/or impurities in the semiconductor wafer as a function of the rate of change.

Step (d) can include determining if the rate of change in step (c) greater than, less than, equal to, or within a desired range of an exemplary rate of change.

The method can further include (e) performing at least one processing step on the semiconductor wafer required to form an integrated circuit thereon; (f) causing a third current value to flow in a semiconductor wafer having a substrate of semiconducting material; (g) exposing the semiconductor wafer to another pulse of light whereupon electron-hole pairs generated in the semiconductor wafer in response to the light pulse cause the current to increase to a fourth value; (h) after termination of the other pulse of light, determining a rate of change of the current from the fourth value toward the third value; (i) determining a concentration of defects and/or impurities in the semiconductor wafer as a function of the rate of change in step (h); and (j) determining if a change between the concentration determined in step (d) and the concentration determined in step (i) is within acceptable tolerance(s).

Lastly, the invention is a system for determining a concentration of defects and/or impurities in a semiconductor wafer. The system includes means for causing a first current value to flow in a semiconductor wafer having a substrate of semiconducting material; means for exposing the semiconductor wafer to a pulse of light to generate electron-hole pairs in the semiconductor wafer that cause the current to increase to a second value; means for determining a rate of change of the current from the second value toward the first value after termination of the light pulse; and means for determining a concentration of defects and/or impurities in the semiconductor wafer as a function of the rate of change from the second current value to the first current value.

Desirably, the means for determining the concentration determines if the rate of change is greater than, less than, equal to, or within a desired range of an exemplary rate of change.

The system can also include means for causing a third current value to flow in the semiconductor wafer after at least one processing step required to form an integrated circuit has been performed on the semiconductor wafer; means for exposing the semiconductor wafer to another pulse of light to generate electron-hole pairs in the semiconductor wafer that cause the current to increase to a fourth value; means for determining a rate of change of the current from the fourth value toward the third value after termination of the other light pulse; means for determining a concentration of defects and/or impurities in the semiconductor wafer as a function of the rate of change from the fourth current value to the third current value; and means for determining if the difference between the concentration determined from the rate of change from the fourth current value to the third current value and the concentration determined from the rate of change from the second current value to the first current value is within acceptable tolerance(s).

BRIEF DESCRIPTION OF THE DRAWINGS

FIG. 2 is a graph of current versus time showing the change in current flowing in the semiconductor wafer of FIG. 1 in response to a pulse of light.

DETAILED DESCRIPTION OF THE INVENTION

Figure 1:
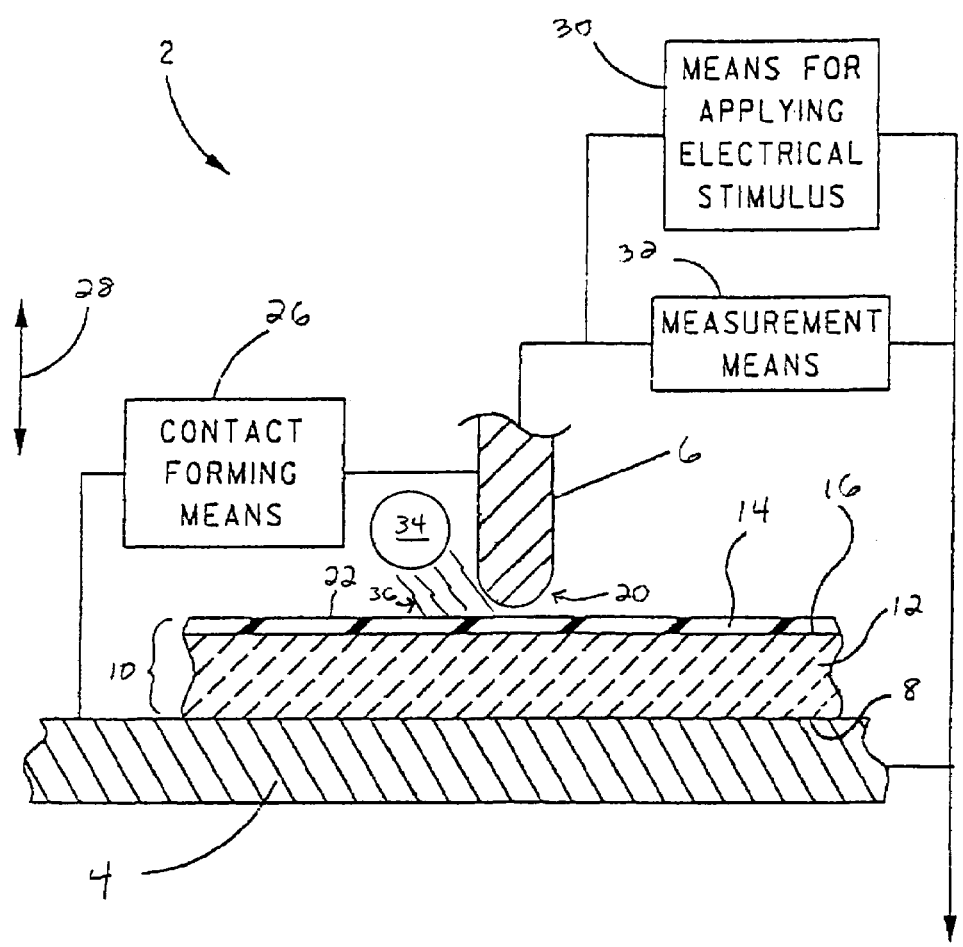
FIG. 1 is a combined block diagram and cross-sectional side view of a semiconductor wafer received on a vacuum chuck of an apparatus for measuring a concentration of defects and/or impurities in the semiconductor wafer.

The present invention will be described with reference to the accompanying figures, where like reference numbers correspond to like elements.

With reference to FIG. 1, a semiconductor wafer test system 2 includes an electrically conductive vacuum chuck 4 and a contact 6. The illustration of contact 6 in FIG. 1 in the form of an elongated probe is not to be construed as limiting the invention since it is envisioned that contact 6 can have any shape or form suitable for testing a semiconductor wafer 10. Alternatively, instead of being a probe, contact 6 can be a drop of liquid mercury (Hg) or other electrically conductive fluid. For the purpose of describing the present invention, hereinafter contact 6 will be considered to be in the form of a probe as shown in FIG. 1.

Chuck 4 is configured to support a backside 8 of semiconductor wafer 10 which includes a substrate 12 formed of semiconducting material which is held in contact with chuck 4 by means of a vacuum (not shown). Semiconductor wafer 10 can, but does not necessarily, include a dielectric layer 14 overlaying a topside 16 of substrate 12.

Desirably, contact 6 includes at least a partially spherical and conductive surface 20 for contacting topside 16 of substrate 12 or a topside 22 of dielectric layer 14 when present. While a partially spherical and conductive surface 20 is desired, it is envisioned that surfaces (not shown) having other shapes suitable for testing semiconductor wafer 10 can be utilized. Accordingly, the illustration in FIG. 1 of surface 20 being partially spherical is not to be construed as limiting the invention.

A contact forming means 26, of the type well known in the art, controls the vertical movement of chuck 4 and/or contact 6, in the directions shown by arrow 28, to move contact 6 and semiconductor wafer 10 toward each other whereupon surface 20 of contact 6 presses into contact with topside 16 of substrate 12 or topside 22 of dielectric layer 14 when present.

A means for applying electrical stimulus 30 can be electrically connected to apply a suitable electrical stimulus to contact 6 and semiconductor wafer 10 when it is received on chuck 4 and surface 20 of contact 6 presses into contact with topside 16 of substrate 12 or topside 22 of dielectric layer 14 when present.

A measurement means 32 can be electrically connected for measuring the response of semiconductor wafer 10 to the test stimulus applied by the means for applying electrical stimulus 30. Desirably, chuck 4 is connected to a reference ground. However, this is not to be construed as limiting the invention since chuck 4 alternatively can be connected to a suitable AC or DC reference bias.

A light source 34, such as a xenon lamp, is positioned to direct light 36 toward semiconductor wafer 10, especially the portion of semiconductor wafer 10 beneath the point where surface 20 of contact 6 presses into contact with topside 16 of substrate 12 or topside 22 of dielectric layer 14 when present.

With reference to FIG. 2, and with continuing reference to FIG. 1, at a suitable time, contact forming means 26 causes surface 20 of contact 6 to press into contact with topside 16 of substrate 12 or topside 22 of dielectric layer 14 when present. Desirably, when contact 6 is in the form of a probe, at least surface 20 is formed from an elastically deformable and electrically conductive material that deforms within its elastic limits when pressed into contact with topside 16 of substrate 12 or topside 22 of dielectric 14 when present. If contact 6 is a drop of liquid mercury (not shown), this drop of liquid mercury, defining surface 20, is simply deposited on topside 16 of substrate 12 or topside 22 of dielectric layer 14 when present. In either event, once this electrical contact has been formed with the top surface of semiconductor wafer 10, means for applying electrical stimulus 30 causes a first value 40 of current I to flow in contact 6 via surface 20 and semiconductor wafer 10.

With first value 40 of current I flowing in semiconductor wafer 10, light source 34 is caused to expose semiconductor wafer 10 under or adjacent the contact between surface 20 and topside 16 of substrate 12 or topside 22 of dielectric layer 14 when present to a pulse of light 36. This pulse of light 36 generates in substrate 12 of semiconductor wafer 10 electron-hole pairs which cause the value of current I flowing in probe 6 to increase from first value 40 to a second value 42 between time t1 and time t2.

After termination of the pulse of light 36, the electron-hole pairs commence recombining whereupon the value of current I flowing in probe 6 changes from the second value 42 back toward the first value 40. During the change of current I in probe 6 from second value 42 at time t2 to first value 40 at time t3, measurement means 32 samples current I flowing in probe 6 a plurality of times. Utilizing these samples, measurement means 32 determines a slope S, or rate of change, of current I between time t2 and time t3. Slope S can be determined for samples acquired during any suitable interval between times t2 and t3 that is deemed to provide an accurate indication of the concentration of defects and/or impurities in semiconductor wafer 10. The thus determined value of slope S can be compared to the value of an exemplary slope acquired from a semiconductor wafer having known and/or desirable concentrations of defects and/or impurities to determine if slope S is greater than, less than, equal to, or within the desired range of the exemplary slope.

It is believed that if dielectric layer 14 is present, it can have the thickness of up to 30 Angstroms without having a substantial effect on the measurement of slope of current I in response to termination of the pulse of light 36. It is believed that this measurement is possible due to a so-called tunneling current which can flow through dielectric layer 14 if dielectric layer 14 is not too thick.

During processing of semiconductor wafer 10 to form integrated circuits thereon, it is possible to introduce defects and/or impurities into semiconductor wafer 10. As an aid to process control, it would be desirable to determine which processing steps contribute to the introduction of defects and/or impurities in semiconductor wafer 10. Accordingly, the foregoing process of causing current I of first value 40 to flow in semiconductor wafer 10 via probe 6, exposing semiconductor wafer 10 to a pulse of light 36, determining slope S of current I during a suitable interval between times t2 and t3 when current I is changing from second value 42 toward first value 40, and determining a concentration of defects and/or impurities in semiconductor wafer 10 as a function of slope S can be repeated two or more times during the processing of semiconductor wafer 10 to form integrated circuits thereon to determine if the concentration of defects and/or impurities therein is changing. For example, the acquisition of data to determine a first slope S1, like slope S in FIG. 2, can be separated temporally from the acquisition of data to determine a second slope S2, also like slope S in FIG. 2, by one or more integrated circuit processing steps. The concentration of defects and/or impurities associated with slope S1 can be compared to the concentration of defects and/or impurities associated with slope S2 to determine if any change in the concentration of defect(s) and/or impurities is within acceptable tolerance(s).

Desirably, light source 34 outputs the same intensity of light 36 each time. However, this is not to be construed as limiting the invention.

As can be seen, the present invention provides a method and apparatus for empirically determining a relative concentration of defect(s) and/or impurities in a semiconductor wafer.

The present invention has been described with reference to the preferred embodiments. Obvious modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A method of determining a concentration of defects and/or impurities in a semiconductor wafer comprising:
   (a) providing a semiconductor wafer having a substrate of semiconducting material;
   (b) forming an electrical contact with a top surface of the semiconductor wafer;
   (c) causing a first current value to flow in the semiconductor wafer via the electrical contact;
   (d) exposing the semiconductor wafer under or adjacent the electrical contact formed in step (b) to light whereupon a second current value flows in the semiconductor wafer;
   (e) terminating the light;
   (f) determining a rate of change of the current from the second value toward the first value; and
   (g) determining a concentration of defects and/or impurities in the semiconductor wafer as a function of the rate of change determined in step (f).

2. The method of claim 1, wherein the top surface of the semiconductor wafer is either a top surface of the semiconducting material of the semiconductor wafer or a top surface of a dielectric layer overlaying the top surface of the semiconducting material of the semiconductor wafer.

3. The method of claim 2, wherein the dielectric layer has a thickness of no greater than about 30 Angstroms.

4. The method of claim 1, wherein step (g) includes determining if the rate of change in step (f) is greater than, less than, equal to, or within a desired range of an exemplary rate of change.

5. The method of claim 1, wherein the electrical contact is formed via one of:
   a probe having an elastically deformable and electrically conductive tip that deforms within its elastic limits when it touches the top surface of the semiconductor wafer but does not damage the top surface of the semiconductor wafer; and
   a drop of liquid mercury deposited on the top surface of the semiconductor wafer.

6. The method of claim 1, further including:
   (h) performing at least one integrated circuit processing step on the semiconductor wafer;
   (i) forming an other electrical contact with the top surface of the semiconductor wafer;
   (j) causing a third current value to flow in the semiconductor wafer via the other electrical contact;
   (k) exposing the semiconductor wafer under or adjacent the other electrical contact formed in step (i) to light whereupon a fourth current value flows in the semiconductor wafer;
   (l) terminating the light;
   (m) determining a rate of change of the current from the fourth value toward the third value;
   (n) determining a concentration of defects and/or impurities in the semiconductor wafer as a function of the rate of change determined in step (m); and
   (o) determining if a change between the concentration determined in step (n) and the concentration determined in step (g) is within an acceptable tolerance.

7. The method of claim 6, wherein at least one of:
   the semiconductor wafer is exposed to the same intensity of light in steps (d) and (k); and
   a difference between the first and third values of current is the same as a difference between the second and fourth values of current.

8. A method of determining a concentration of defects and/or impurities in a semiconductor wafer comprising:
   (a) causing a first current value to flow in a semiconductor wafer having a substrate of semiconducting material;
   (b) exposing the semiconductor wafer to a pulse of light whereupon electron-hole pairs generated in the semiconductor wafer in response to the pulse of light cause the current to increase to a second value;
   (c) after termination of the pulse of light, determining a rate of change of the current from the second value toward the first value; and
   (d) determining a concentration of defects and/or impurities in the semiconductor wafer as a function of the rate of change.

9. The method of claim 8, wherein the top surface of the semiconductor wafer is either a top surface of the semiconducting material of the semiconductor wafer or a top surface of a dielectric layer overlaying the top surface of the semiconducting material of the semiconductor wafer.

10. The method of claim 9, wherein the dielectric layer has a thickness of no greater than about 30 Angstroms.

11. The method of claim 8, wherein step (d) includes determining if the rate of change in step (c) is greater than, less than, equal to, or within a desired range of an exemplary rate of change.

12. The method of claim 8, further including:
(e) performing at least one processing step on the semiconductor wafer required to form an integrated circuit thereon;
(f) causing a third current value to flow in a semiconductor wafer having a substrate of semiconducting material;
(g) exposing the semiconductor wafer to an other pulse of light whereupon electron-hole pairs generated in the semiconductor wafer in response to the pulse of light cause the current to increase to a fourth value;
(h) after termination of the other pulse of light, determining a rate of change of the current from the fourth value toward the third value;
(i) determining a concentration of defects and/or impurities in the semiconductor wafer as a function of the rate of change in step (h); and
(j) determining if a change between the concentration determined in step (d) and the concentration determined in step (i) is within an acceptable tolerance.

13. The method of claim 12, wherein at least one of:
the semiconductor wafer is exposed to the same intensity of light in steps (b) and (g); and
a difference between the first and third values of current is the same as a difference between the second and fourth values of current.

14. A system for determining a concentration of defects and/or impurities in a semiconductor wafer comprising:
means for causing a first current value to flow in a semiconductor wafer having a substrate of semiconducting material;
means for exposing the semiconductor wafer to a pulse of light to generate electron-hole pairs in the semiconductor wafer that cause the current to increase to a second value;
means for determining a rate of change of the current from the second value toward the first value after termination of the pulse of light; and
means for determining a concentration of defects and/or impurities in the semiconductor wafer as a function of the rate of change from the second current value to the first current value.

15. The system of claim 14, wherein the top surface of the semiconductor wafer is either a top surface of the semiconducting material of the semiconductor wafer or a top surface of a dielectric layer overlaying the top surface of the semiconducting material of the semiconductor wafer.

16. The system of claim 15, wherein the dielectric layer has a thickness of no greater than about 30 Angstroms.

17. The system of claim 14, wherein the means for determining the concentration determines if the rate of change is one of greater than, less than, equal to, or within a desired range of an exemplary rate of change.

18. The system of claim 14, further including:
means for causing a third current value to flow in the semiconductor wafer after at least one processing step required to form an integrated circuit has been performed on the semiconductor wafer;
means for exposing the semiconductor wafer to an other pulse of light to generate electron-hole pairs in the semiconductor wafer that cause the current to increase to a fourth value;
means for determining a rate of change of the current from the fourth value toward the third value after termination of the other pulse of light;
means for determining a concentration of defects and/or impurities in the semiconductor wafer as a function of the rate of change from the fourth current value to the third current value; and
means for determining if the difference between the concentration determined from the rate of change from the fourth current value to the third current value and the concentration determined from the rate of change from the second current value to the first current value is within an acceptable tolerance.

19. The system of claim 18, wherein at least one of:
each pulse of light has the same intensity; and
a difference between the first and third values of current is the same as a difference between the second and fourth values of current.

* * * * *